(12) United States Patent
Awusie

(10) Patent No.: US 11,367,502 B2
(45) Date of Patent: Jun. 21, 2022

(54) BAD BLOCK MANAGEMENT FOR MEMORY SUB-SYSTEMS

(71) Applicant: Micron Technology, Inc, Boise, ID (US)

(72) Inventor: Roland J. Awusie, Boise, ID (US)

(73) Assignee: Micron Technology, Inc, Boise, ID (US)

( * ) Notice: Subject to any disclaimer, the term of this patent is extended or adjusted under 35 U.S.C. 154(b) by 0 days.

(21) Appl. No.: 16/924,938

(22) Filed: Jul. 9, 2020

(65) Prior Publication Data
US 2020/0342949 A1  Oct. 29, 2020

Related U.S. Application Data

(62) Division of application No. 16/228,387, filed on Dec. 20, 2018, now Pat. No. 10,726,936.

(51) Int. Cl.
| | |
|---|---|
| *G11C 29/00* | (2006.01) |
| *G11C 29/44* | (2006.01) |
| *G11C 29/38* | (2006.01) |
| *G11C 11/56* | (2006.01) |
| *G11C 16/04* | (2006.01) |

(52) U.S. Cl.
CPC ............. *G11C 29/44* (2013.01); *G11C 29/38* (2013.01); *G11C 11/5621* (2013.01); *G11C 16/0483* (2013.01)

(58) Field of Classification Search
None
See application file for complete search history.

(56) References Cited

U.S. PATENT DOCUMENTS

| | | | |
|---|---|---|---|
| 5,920,502 A | 7/1999 | Noda et al. | |
| 2005/0114726 A1* | 5/2005 | Ouchi | G11B 20/1833 714/5.1 |
| 2005/0144382 A1 | 6/2005 | Schmisseur | |
| 2007/0294570 A1* | 12/2007 | Polisetti | G06F 11/2094 714/6.13 |
| 2009/0259896 A1 | 10/2009 | Hsu et al. | |
| 2010/0172179 A1* | 7/2010 | Gorobets | G06F 12/0866 365/185.09 |
| 2010/0250831 A1 | 9/2010 | OBrien et al. | |
| 2016/0342345 A1* | 11/2016 | Kankani | G06F 3/0653 |
| 2018/0293014 A1* | 10/2018 | Ravimohan | G11C 16/10 |
| 2019/0102083 A1* | 4/2019 | Dusija | G06F 3/0679 |
| 2019/0310923 A1* | 10/2019 | Jun | G06F 11/27 |
| 2020/0192807 A1* | 6/2020 | Rub | G06F 12/0871 |

* cited by examiner

*Primary Examiner* — Mujtaba M Chaudry
(74) *Attorney, Agent, or Firm* — Lowenstein Sandler LLP

(57) ABSTRACT

A processing device in a memory system performs operations comprising determining a first pool of data blocks of the memory device, wherein data blocks of the first pool are associated with storing data at a first number of bits per memory cell; determining a second pool of data blocks of the memory device, wherein data blocks of the second pool are associated with storing data at a second number of bits per memory cell that is larger than the first number of bits per memory cell; detecting a failure associated with a particular data block of the second pool of data blocks; and in response to detecting the failure associated with the particular data block, removing the particular data block from the second pool of data blocks and adding the particular data block to the first pool of data blocks.

20 Claims, 6 Drawing Sheets

BAD BLOCK MANAGEMENT FOR MEMORY SUB-SYSTEMS

RELATED APPLICATION

The present Application is a divisional application of U.S. patent application Ser. No. 16/228,387, filed on Dec. 20, 2018, which is incorporated by reference herein in its entirety.

TECHNICAL FIELD

Embodiments of the disclosure relate generally to memory sub-systems, and more specifically, relate to managing bad blocks for a memory sub-system.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
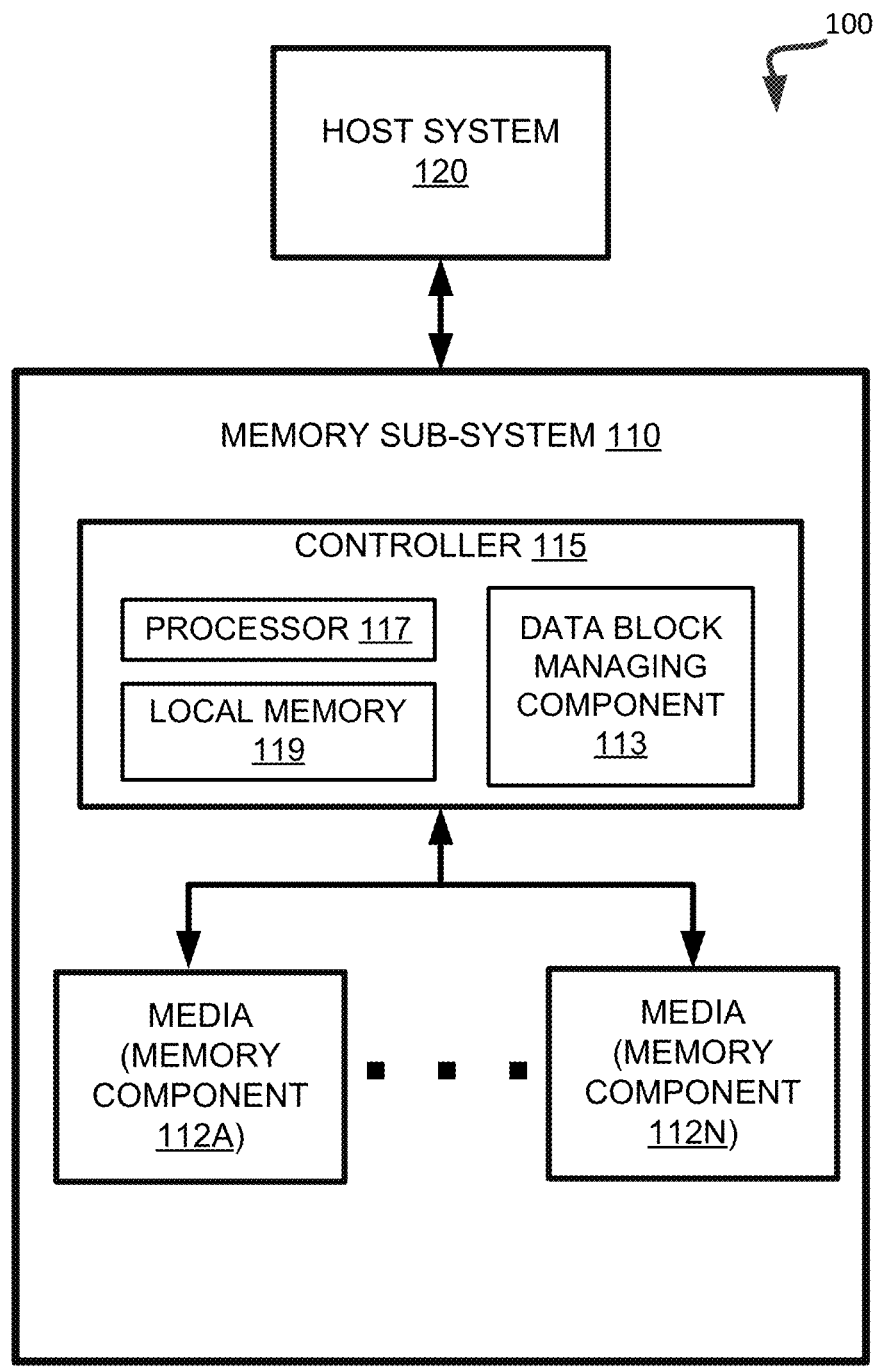
FIG. 1 illustrates an example computing environment that includes a memory sub-system in accordance with some embodiments of the present disclosure.

Aspects of the present disclosure are directed managing bad blocks for a memory sub-system. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system can be a hybrid memory/storage sub-system. In general, a host system can utilize a memory sub-system that includes one or more memory components. The host system can provide data to be stored at the memory sub-system and can request data to be retrieved from the memory sub-system.

The memory sub-system can include multiple memory components that can store data from the host system. Each memory component can include a different type of media. Examples of media include, but are not limited to, a cross-point array of non-volatile memory and flash based memory such as single-level cell (SLC) memory, triple-level cell (TLC) memory, and quad-level cell (QLC) memory. Different types of media can have different data density. Data density corresponds to an amount of data (e.g., bits of data) that can be stored per memory cell of a memory component. Using the example of a flash based memory, a quad-level cell (QLC) can store four bits of data while a single-level cell (SLC) can store one bit of data. Accordingly, a memory component including QLC memory cells will have a higher data density than a memory component including SLC memory cells. A memory cell can be converted to a different type by storing a different number of bits of data at the memory cell. For example, a QLC memory cell can become an SLC memory cell if a single bit of data is written to the memory cell that was previously used to store four bits of data.

A conventional memory sub-system includes memory components having bad data blocks. A bad data block (hereinafter also referred to as "bad block") is a data block (i.e., a group of one or more memory cells in a memory component) that cannot reliably store data. For example, a bad data block can refer to a data block that satisfies a failure condition as described in further detail below. Due to non-uniformity and variation in a manufacturing process, the conventional memory sub-system initially includes a small percentage of bad data blocks. In addition, good data blocks (i.e., data blocks that are not classified as a bad data block and that can initially reliably store data) can become bad data blocks as data blocks wear out during the lifetime of the memory sub-system. Accordingly, bad data blocks in the conventional memory sub-system have not been used to store data. Instead, the conventional memory sub-system can track the bad data blocks and avoid storing any data at the bad data blocks. Therefore, the memory capacity of the conventional memory sub-system can decrease as more data blocks become unreliable and not used for data storage.

Aspects of the present disclosure address the above and other deficiencies by utilizing bad data blocks to store a specific number of bits of data per memory cell of a bad data block. Although memory cells of bad data blocks can be unreliable to store a large number of bits of data, the memory cells can still be used to reliably store a single bit of data. For example, the bad data block can be degraded over time and cannot reliably store multiple bits at the memory cell, but the bad data block can still reliably store fewer bits (e.g., one bit) at the memory cells. Typically, an SLC or a memory cell written in an SLC mode has a wider read margin that separates states of bits (i.e., bit values) than a reading margin of a QLC memory cell, or any other multi-level cells. The wider reading margin would result in a possibility of less error as there is a larger separation between the states of bits as fewer bits are stored at the SLC memory cell. For example, a memory cell storing a single bit can include two states or bit values (e.g., a 0 or a 1) while a memory cell storing four bits can include sixteen states or bit values (e.g., 0000 to 1111). The entire reading margin of a memory cell can be used to separate between the two states or bits when the memory cell includes the two states or bit values. However, the same reading margin of the memory cell can be divided between the sixteen states or bit values when the memory cell is to store sixteen states or bit values. Thus, the reading margin between the states or bit values of an SLC memory cell can be larger than the reading margin between the states or bit values of a QLC memory cell.

Therefore, even if the memory cell of bad data blocks may not be reliable to be used as a QLC memory cell, the memory cell can still be used as an SLC memory cell. In this way, the memory sub-system can still utilize bad data blocks in addition to the good data blocks. Further, the bad data blocks can be used to store system data such as log information, maintenance information, and characteristics of the memory sub-system while the good data blocks can be used to store user data.

Advantages of the present disclosure include, but are not limited to, an increased storage capacity of the memory sub-system as the bad data blocks can be used to store certain types of system data. Furthermore, since the system data would be stored and/or retrieved from the bad data blocks in an SLC mode, the performance of the memory sub-system can be improved as the reading and writing of data to memory cells in the SLC mode can be faster when compared to using operations using a QLC mode (e.g., the default mode). FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative- and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. The memory cells can be a part of bad data blocks or good data blocks. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative- or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a data block managing component 113 that can be used to store data at a bad data block or good data block based on a type of data. In some embodiments, the controller 115 includes at least a portion of the data block managing component 113. For example, the controller 115 can include a processor 117 (processing device) configured to execute instructions stored in local memory 119 for performing the operations described herein. In some embodiments, the data block managing component 113 is part of the host system 120, an application, or an operating system.

The data block managing component 113 can receive data to be stored in memory components 112A to 112N of the memory sub-system 110. The data block managing component 113 can, based on the type of data, determine to store the data to a bad data block or a good data block. The data block managing component 113 can reference a data structure (e.g., a table) or information specifying locations of bad data blocks and/or good data blocks to identify which data block to use. The data block managing component 113 can also maintain the data structure or information specifying locations of bad data blocks and/or good data blocks over time as good data blocks become associated with a failure condition and become bad data blocks. When storing data to a bad data block, the data block managing component 113 can perform read or write operation in an SLC mode. Further details with regards to the operations of the data block managing component 113 are described below.

Figure 2A:
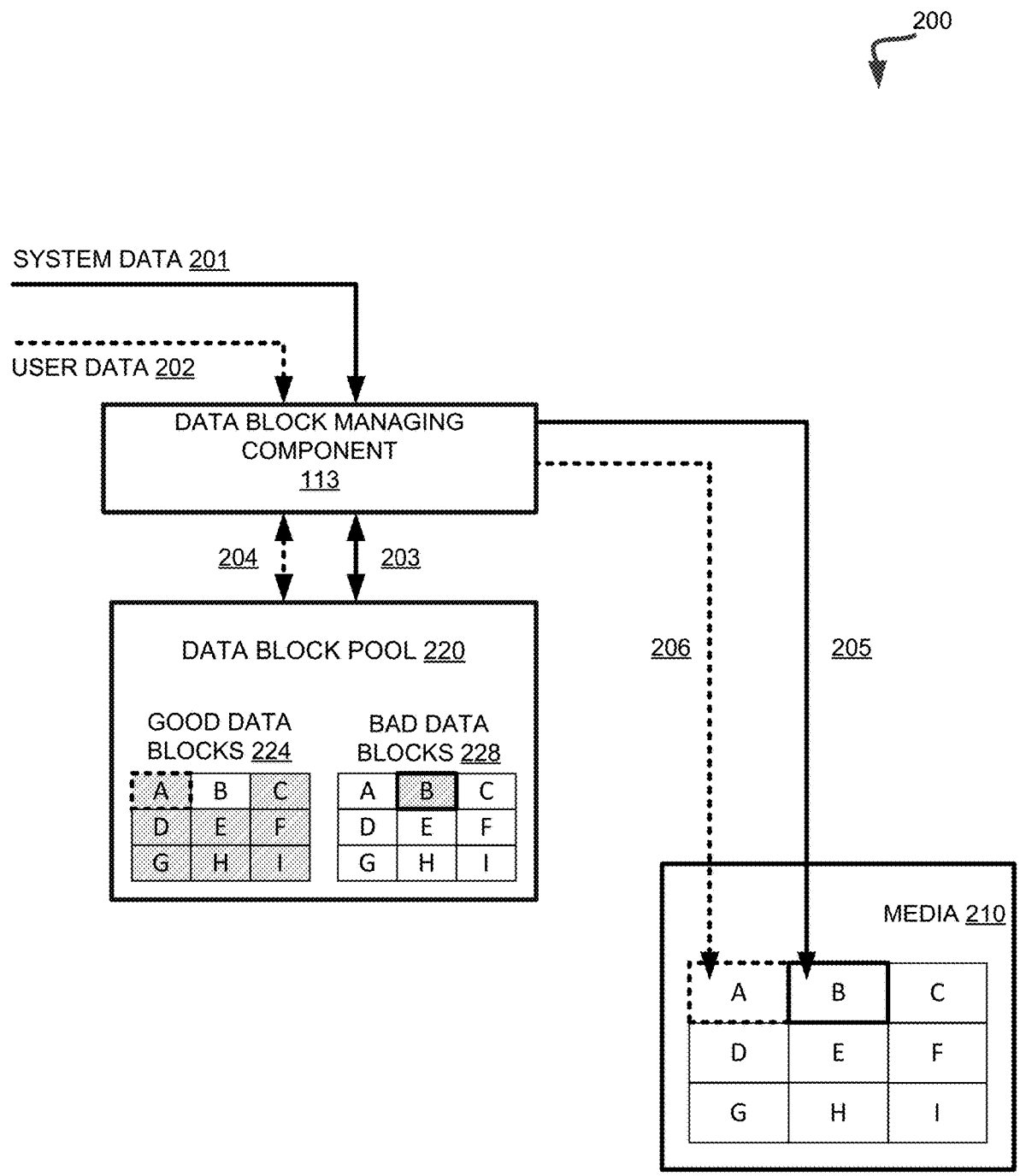
FIG. 2A illustrates an example of determining whether to store data at a bad data block in accordance with some embodiments of the present disclosure.

FIG. 2A illustrates an example of determining whether to store data at a bad data block in accordance with some embodiments of the present disclosure. The memory sub-system 200 includes the data block managing component 113, information about data block pool 220, and a media 210. The data block pool 220 can be in a form of a data structure stored at the local memory 119 of the memory sub-system 110 or the data block managing component 113. In some embodiments, the data block pool 220 can be stored as metadata in the media 210. The data block pool 220 corresponds to a record or table for locations of data blocks that are classified as bad data blocks or good data blocks. The data block pool 220 can include information about a pool of good data blocks 224 and a pool of bad data blocks 228. The record for the pool of good data blocks 224 and bad data blocks 228 can be in a form of a list, a table, or any other suitable data structure. The pool of bad data blocks 228 can initially be provided from a manufacturer of the memory sub-system 110. For example, at an initial operating point of the memory sub-system 110, the pool of bad data blocks 228 can identify the data blocks of the memory sub-system 110 that are considered to be bad data blocks at manufacturing of the memory sub-system 110. In some embodiments, the pool of bad data blocks 228 can be updated throughout the lifetime of the memory sub-system 110 by the data block managing component 113 as described with respect to FIG. 2B below. The pool of good data blocks 224 can be derived from the default information about the pool of bad data blocks 228. For example, if the data block managing component 113 is only given the information about the pool of bad data blocks 228 (e.g., at the initial operating point of the memory sub-system 110), then the data block managing component 113 can determine the pool of good data blocks 224 as data blocks that are complementary to the pool of bad data blocks 228. The pool of good data blocks 224 can be any other data blocks not included in the pool of bad data blocks 228. The media 210 can be any media 112A to 112N connected with the data block managing component 113 as illustrated in FIG. 1.

The data block managing component 113 can determine which data block (i.e., bad or good data block) to store the received data based on the type of data. As illustrated, by flow 201, the data block managing component 113 can receive system data of the memory sub-system 110. The system data can correspond to any data generated by the memory sub-system 110. In some embodiments, the system data can be metadata of user data or information that is generated when user data is stored at the memory sub-system 110. In response, the data block managing component 113 can access the data block pool 220 to determine from the pool of bad data blocks 228 which bad data block (e.g., a data block "B") is available for storing the system data. The data block managing component 113 can store the received system data at data block B as illustrated by flow 205. The data block managing component 113 can further store the system data to the bad block B using an SLC programming operation (i.e., a programming operation involving a single bit of data per memory cell). In another example, the data block managing component 113 can receive user data of the host system 120 as represented by flow 202. The user data can correspond to data received from the host system 120. The data block managing component 113 can similarly access the data block pool 220 for information on the pool of good data blocks 224. The pool of good data blocks 224 can correspond to a map that indicates which data blocks of the media 210 are good data blocks. Once the data block managing component 113 determines which good data block (i.e., a data block "A") is available, the data block managing component 113, as shown by flow 206, can store the user data at the data block A. The data block managing component 113 can use a default programming operation, such as a QLC programming operation to store data at the good data block. In some embodiments, the data block managing component 113 can use any other programming operation such as an MLC or TLC programming operation. For example, the programming operation for the good data blocks can be any type of programming operation that writes more bits per memory cell than the programming operation that is used to store data at the memory cells of the bad data blocks. Accordingly, if the received data is system data, the data block managing component 113 can determine to store the system data at a bad data block, the user data can be stored at a good data block. Thus, the data block managing component 113 can improve the use of the media 210 at a memory sub-system.

Figure 2B:
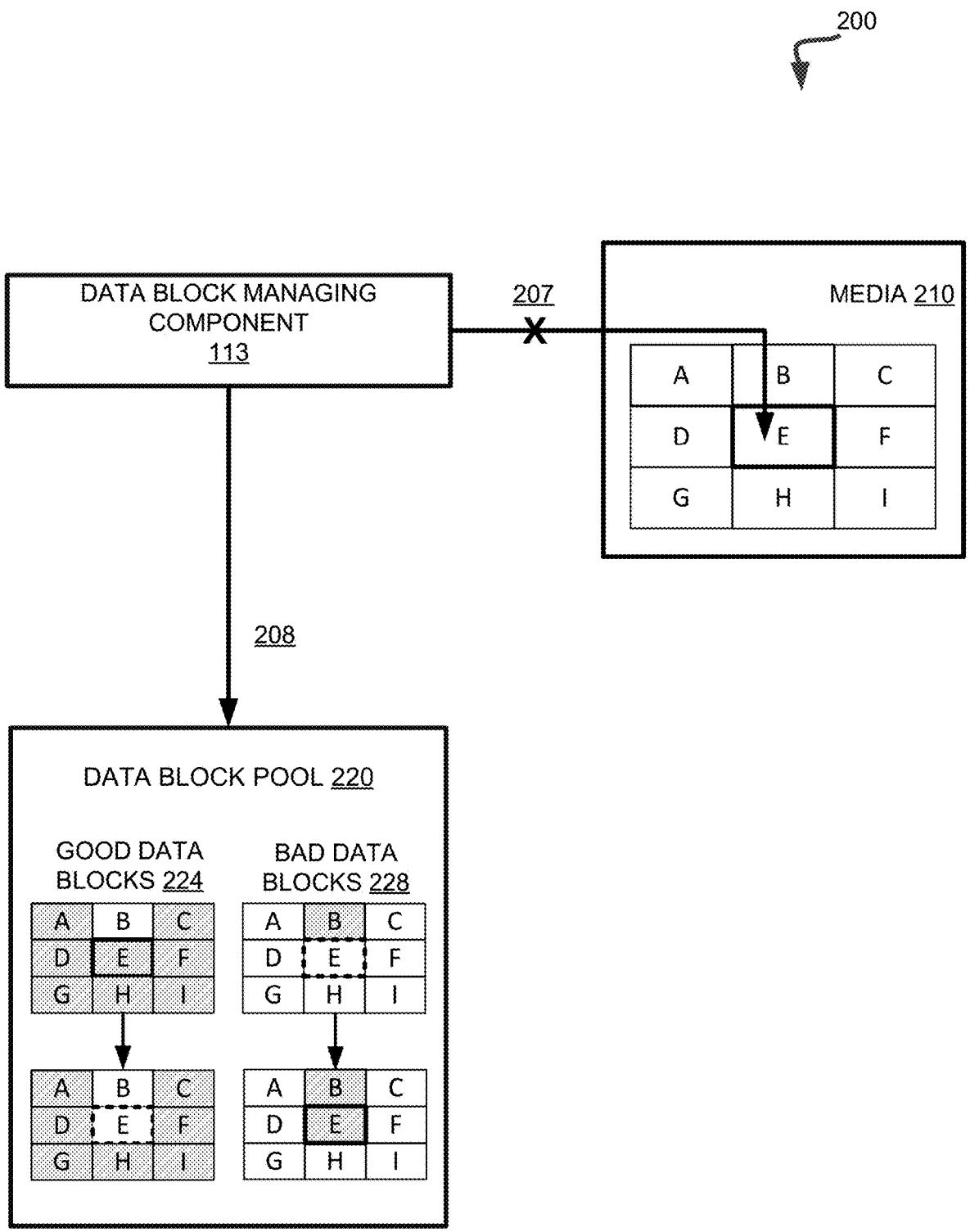
FIG. 2B illustrates an example of updating a pool of bad data blocks in accordance with some embodiments of the present disclosure.

FIG. 2B illustrates an example of updating a pool of bad data blocks in accordance with some embodiments of the present disclosure. Similar to FIG. 2A, the memory sub-system 200 includes the data block managing component 113, the information about the data block pool 220, and the media 210. As shown by flow 207, the data block managing component 113 can detect a failure of a data block E of the media 210. For example, the data block managing component 113 can detect the failure when the data block managing component 113 cannot retrieve data stored at the data block E, or cannot write to data at the data block E. In some embodiments, the data block managing component 113 can detect a failure of the data block E when data read from the data block E includes a number of errors that satisfies a threshold amount of errors. For example, the data block E can be considered to be associated with the failure condition when the number of errors or the rate of errors from data stored at the data block E exceeds a threshold number or a threshold rate of errors. Such a number of errors or rate of errors can increase when more memory cells of the data block E become degraded throughout the lifetime of the memory sub-system 110. In some embodiments, such errors are associated with data stored using a QLC programming operation. Upon such failure, the data block managing component 113 can regard the data block E as a bad data block. Accordingly, the data block managing component 113, per flow 208, updates the data block pool 220. As illustrated, the data block E which was previously a good data block is removed from the pool of good data blocks 224 and is added to the pool of bad data blocks 228. As such, the data block managing component 113 can maintain the record of the data block pool 220 whenever such a failure of a data block is detected. In this way, the most up-to-date information about the data block pool 220 can be used to maximize the storage capacity of the memory sub-system 110.

Figure 3:
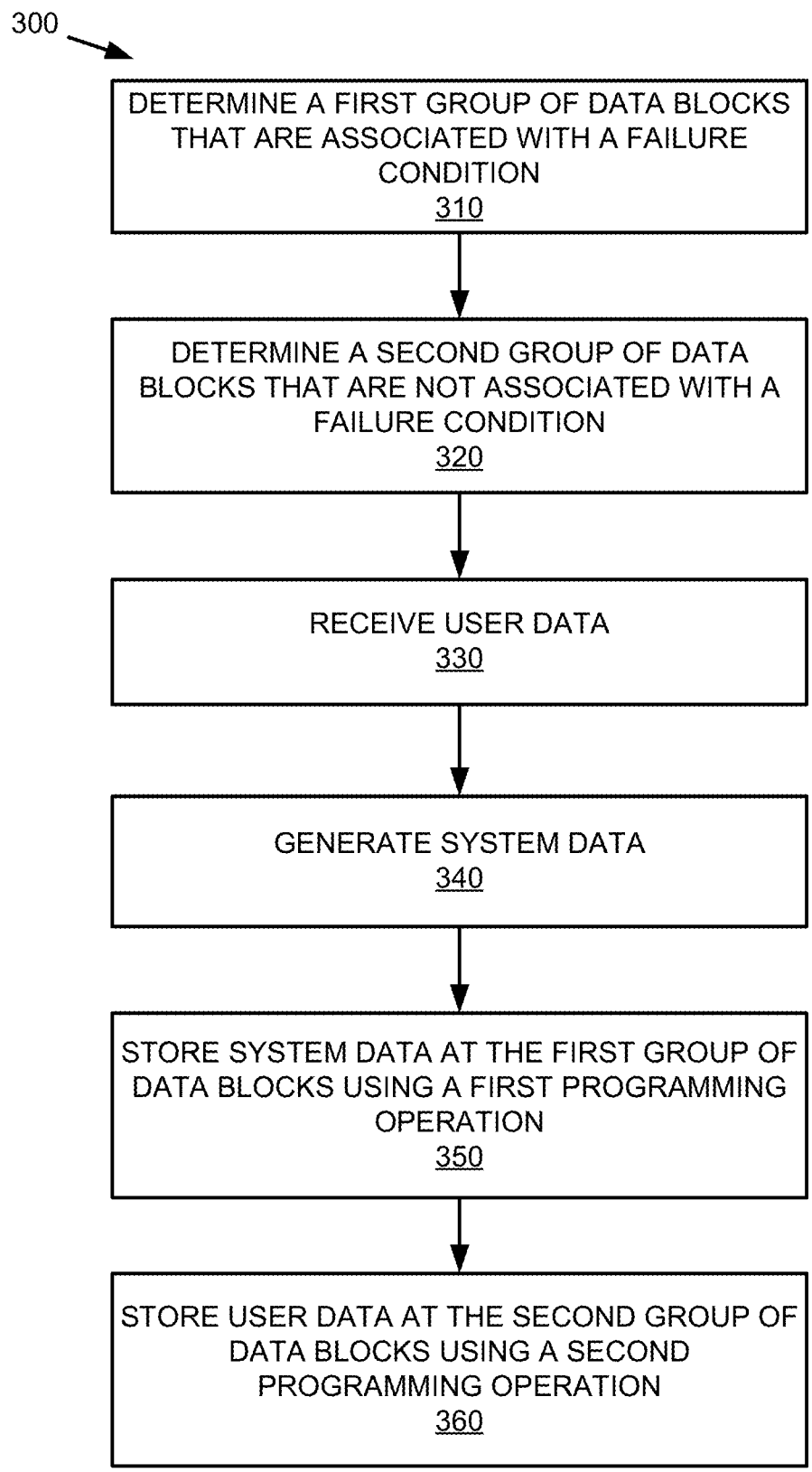
FIG. 3 is a flow diagram of an example method to store data at a bad data block of a memory sub-system based on a type of data in accordance with some embodiments of the present disclosure.

FIG. 3 is a flow diagram of an example method to store data at a bad data block of a memory sub-system 110 based on a type of data in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the data block managing component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing device determines a first group of data blocks of a memory sub-system that are associated with a failure condition. The first group of data blocks can be referred to as a group of bad data blocks. The failure condition can refer to a failure associated with a memory cell with a particular number of bits (e.g., QLC) or a failure related to a particular type of data (e.g., user data). For example, the processing device can detect a failure condition on a particular data block that stored user data and identify the particular data block as a part of the first group of data blocks. The processing device can detect the failure condition when a read or write operation on the particular data block that stored data under the QLC mode has failed. In some embodiments, the processing device can detect the failure condition when the read or write operation for data block storing user data has failed.

For example, the processing device can determine that the particular data block is associated with a failure of a read operation when the processing device cannot retrieve a particular user data stored on the particular data block where the particular user data was stored using the QLC programming operation. As another example, the processing device can determine that a write operation on a particular data block to store user data by using the QLC programming operation has failed. The processing device can then identify that the particular data block is associated with the failure condition.

At operation 320, the processing device determines a second group of data of the memory sub-system that are not associated with the failure condition. The second group of data blocks can be good data blocks of the memory sub-system 110 that are not associated with the failure condition described above with respect to operation 310. For example, the processing device can identify a good data block when a read operation or write operation on a data block is successful regardless of the number of bits or type of data the respective data block stores. In some embodiments, in case the failure condition is associated with a failure of a read or write operation on a memory cell with a particular number of bits (e.g., QLC), then the processing device can identify as a good data block a data block with SLC, MLC, or TLC even though a read or write operation on the respective data block has failed, as well as a data block with QLC where a read or write operation was successful.

At operation 330, the processing device receives user data. The user data can be any data received from the host system 120. For example, the processing device can receive data from the host system 120 that is to be stored at the memory sub-system. The processing device, at operation 340, generates system data of the memory sub-system 110. The system data can correspond to any data generated by the memory sub-system 110 but not the user data that is received from the host system 110 of the memory sub-system 110. For example, the system data can be any data that identifies characteristics of the memory sub-system 110 such as temperature of the memory sub-system 110, maintenance information, and log information. In another example, the system data can be metadata for the user data that is received from a host system 120 of the memory sub-system 110. Thus, the system data can be information generated by the memory sub-system when user data is received to be stored by the memory sub-system 110. The system data can identify a characteristic of the memory sub-system when the respective user data is stored at the memory sub-system.

At operation 350, the processing device stores the system data at the first group of data blocks (i.e., bad data blocks) that is associated with the failure condition by using a first programming operation (e.g., an SLC programming operation). Furthermore, at operation 360, the processing device stores the user data at the second group of data blocks (i.e., good data blocks) that is not associated with the failure condition by using a second programming operation (e.g., a QLC programming operation) that is different than the first programming operation. The first programming operation can correspond to storing a first number of bits (e.g., one) per memory cell of the first group of data blocks (i.e., bad data blocks) that is to store the system data. However, the second programming operation can correspond to programming a second number of bits (e.g., four) per memory cell of the second group of data blocks (i.e., good data blocks) that is to store the user data. The second number of bits per memory cell can be larger than the first number of bits per memory cell.

Figure 4:
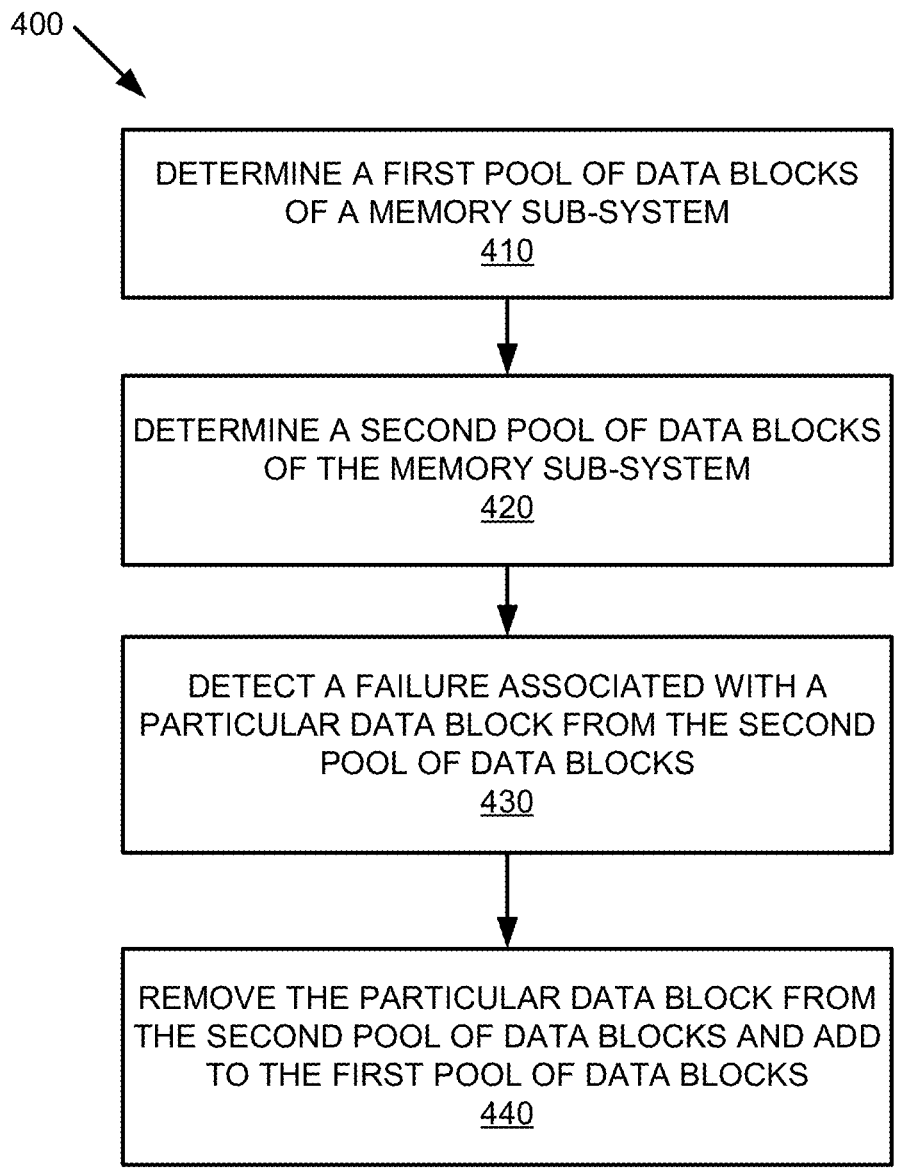
FIG. 4 is a flow diagram of an example method to manage a pool of bad data blocks of a memory sub-system in accordance with some embodiments of the present disclosure.

FIG. 4 is a flow diagram of an example method to manage a pool of bad data blocks of a memory sub-system 110 in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the data block managing component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing device determines a first pool of data blocks (e.g., bad data blocks) of a memory sub-system 110. Upon manufacturing, the memory sub-system 110 can initially contain bad data blocks. Accordingly, information about locations of bad data blocks can be provided by the manufacturer and the processing device can access such information. On the other hand, bad data blocks can develop during the lifetime of the memory sub-system 110. In any case, a record of bad data blocks can be maintained by the processing device. As described above with respect to operation 350, data blocks of the first pool (i.e., pool of bad data blocks) are associated with storing data at a first number of bits (e.g., single) per memory cell of each data block of the first pool.

The processing device, at operation 420, determines a second pool of data blocks (i.e., good data blocks) of the memory sub-system 110. The processing device can access a record of bad data blocks and/or good data blocks to determine which group of data blocks are good data blocks. Data blocks of the second pool (i.e., pool of good data blocks) are associated with storing data at a second number of bits (e.g., four) per memory cell that is larger than the first number of bits (e.g., single) per memory cell as described above with respect to operation 360.

At operation 430, the processing device detects a failure associated with a particular data block of the second pool of data blocks (i.e., good data blocks). The processing device can detect the failure as described above with respect to operation 310 of FIG. 3. For example, the processing device can determine that a particular data block is associated with a failure condition when the processing device cannot retrieve stored data from or write data to the particular data block when using the QLC operation.

In response, the processing device, at operation 440, removes the particular data block from the second pool of data blocks (i.e., good data blocks) and adds the particular data block to the first pool of data blocks (i.e., bad data blocks). As such, the processing device can update the bad block data location information. The processing device can repeat operations 430 and 440 on a periodic basis or when triggered by a specific condition such as upon receiving system data from the host system 120. The processing device can further erase data stored at the particular data block from the second pool of data blocks (i.e., good data blocks) before adding the particular data block to the first pool of data blocks (i.e., bad data blocks). After performing the operation 440, the processing device can proceed with operations of FIG. 3 to store user data from the host system 120 to good data blocks and system data of the memory sub-system 110 to bad data blocks using the SLC programming operation.

After the first and/or second pool of data blocks have been updated, the processing device can attempt to perform the operation associated with the failure detected at operation 430. In case of a write operation, the processing device can look up the record of bad data blocks and/or good data blocks and determine a good data block to store data. On the other hand, in case a read operation has failed, the processing device can proceed to perform a data rebuild operation in order to recover data stored at the particular data block associated with the failure. For example, the data can be reconstructed based on a combination of other data and corresponding parity data.

Figure 5:
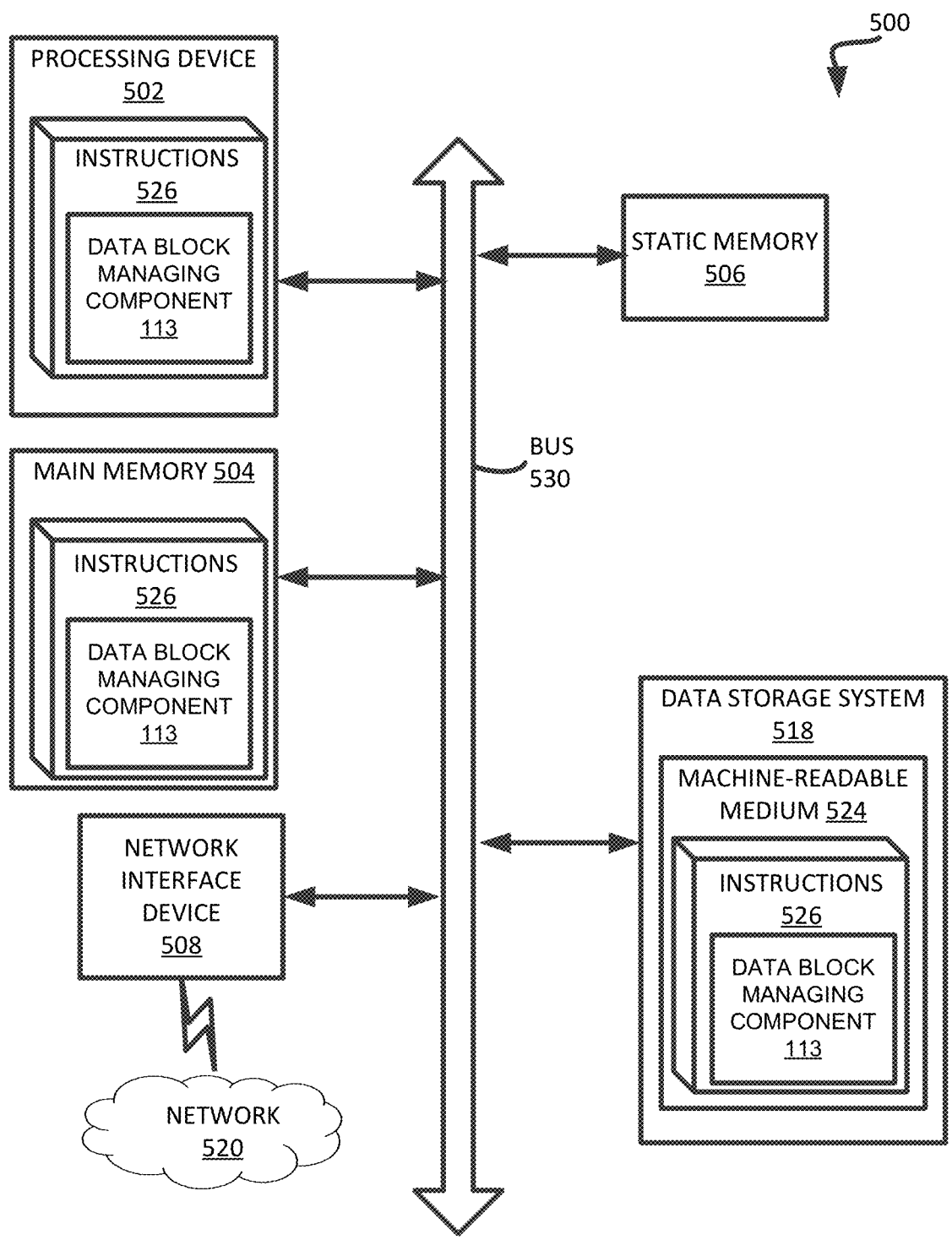
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the data block managing component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a data block managing component (e.g., the data block managing component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
 a memory device; and
 a processing device, operatively coupled with the memory device, to perform operations comprising:
  determining a first pool of blocks of the memory device, wherein blocks of the first pool are associated with storing system data at a single bit per memory cell;

determining a second pool of blocks of the memory device, wherein blocks of the second pool are associated with storing user data at a plurality of bits per memory cell;

determining a number of errors associated with a particular block of the second pool of blocks;

detecting a failure associated with the particular block of the second pool of blocks, wherein detecting the failure comprises determining that the number of errors associated with the particular block satisfies a threshold error criterion; and in response to detecting the failure associated with the particular block, removing the particular block from the second pool of blocks and adding the particular block to the first pool of blocks.

2. The system of claim 1, wherein detecting the failure associated with the particular block further comprises:

determining that reading the particular block at the plurality of bits per memory cell has failed to retrieve a stored data at the particular block.

3. The system of claim 1, wherein detecting the failure associated with the particular block further comprises:

determining that writing data to the particular block at the plurality of bits per memory cell has failed.

4. The system of claim 1, wherein removing the particular block from the second pool of blocks and adding the particular block to the first pool of blocks further comprise:

erasing data stored at the particular block from the second pool of blocks; and adding the particular block to the first pool of blocks in response to erasing the data.

5. The system of claim 1, wherein the processing device to perform operations further comprising:

receiving user data;

generating system data of a memory sub-system associated with the memory device;

storing the user data to a block from the second pool of blocks at the plurality of bits per memory cell; and storing the system data to a block from the first pool of blocks at the single bit per memory cell.

6. The system of claim 5, wherein storing the system data to the block from the first pool of blocks at the single bit per memory cell further comprises storing the system data at a single-level cell (SLC) mode, and wherein storing the user data to the block from the second pool of blocks at the plurality of bits per memory cell further comprises storing the user data by using a programming operation that stores a plurality of bits per each memory cell.

7. The system of claim 5, wherein the system data corresponds to a characteristic of the memory sub-system at a time when the user data is stored at the memory sub-system.

8. A method comprising:

determining a first pool of blocks of a memory device, wherein blocks of the first pool are associated with storing system data at a single bit per memory cell;

determining a second pool of blocks of the memory device, wherein blocks of the second pool are associated with storing user data at a plurality of bits per memory cell;

determining a number of errors associated with a particular block of the second pool of blocks;

detecting a failure associated with the particular block of the second pool of blocks, wherein detecting the failure comprises determining that the number of errors associated with the particular block satisfies a threshold error criterion; and in response to detecting the failure associated with the particular block, removing the particular block from the second pool of blocks and adding the particular block to the first pool of blocks.

9. The method of claim 8, wherein detecting the failure associated with the particular block further comprises:

determining that reading the particular block at the plurality of bits per memory cell has failed to retrieve a stored data at the particular block.

10. The method of claim 8, wherein detecting the failure associated with the particular block further comprises:

determining that writing data to the particular block at the plurality of bits per memory cell has failed.

11. The method of claim 8, wherein removing the particular block from the second pool of blocks and adding the particular block to the first pool of blocks further comprise:

erasing data stored at the particular block from the second pool of blocks; and adding the particular block to the first pool of blocks in response to erasing the data.

12. The method of claim 8 further comprising:

receiving user data;

generating system data of a memory sub-system associated with the memory device;

storing the user data to a block from the second pool of blocks at the plurality of bits per memory cell; and storing the system data to a block from the first pool of blocks at the single bit per memory cell.

13. The method of claim 12, wherein storing the system data to the block from the first pool of blocks at the single bit per memory cell further comprises storing the system data at a single-level cell (SLC) mode, and wherein storing the user data to the block from the second pool of blocks at the plurality of bits per memory cell further comprises storing the user data by using a programming operation that stores a plurality of bits per each memory cell.

14. The method of claim 12, wherein the system data corresponds to a characteristic of the memory sub-system at a time when the user data is stored at the memory sub-system.

15. A non-transitory computer-readable storage medium comprising instructions that, when executed by a processing device, cause the processing device to perform operations comprising:

determining a first pool of blocks of a memory device, wherein blocks of the first pool are associated with storing system data at a single bit per memory cell;

determining a second pool of blocks of the memory device, wherein blocks of the second pool are associated with storing user data at a plurality of bits per memory cell;

determining a number of errors associated with a particular block of the second pool of blocks;

detecting a failure associated with the particular block of the second pool of blocks, wherein detecting the failure comprises determining that the number of errors associated with the particular block satisfies a threshold error criterion; and in response to detecting the failure associated with the particular block, removing the particular block from the second pool of blocks and adding the particular block to the first pool of blocks.

16. The non-transitory computer-readable storage medium of claim 15, wherein detecting the failure associated with the particular block further comprises:

determining that reading the particular block at the plurality of bits per memory cell has failed to retrieve a stored data at the particular block.

17. The non-transitory computer-readable storage medium of claim 15, wherein detecting the failure associated with the particular block further comprises:

determining that writing data to the particular block at the plurality of bits per memory cell has failed.

18. The non-transitory computer-readable storage medium of claim 15, wherein removing the particular block from the second pool of blocks and to add the particular block to the first pool of blocks further comprises:

erasing data stored at the particular block from the second pool of blocks; and adding the particular block to the first pool of blocks in response to erasing the data.

19. The non-transitory computer-readable storage medium of claim 15, wherein the processing device is to perform operations further comprising:

generating system data of a memory sub-system associated with the memory device;

storing the user data to a block from the second pool of blocks at the plurality of bits per memory cell; and storing the system data to a block from the first pool of blocks at the single bit per memory cell.

20. The non-transitory computer-readable storage medium of claim 19, wherein the system data corresponds to a characteristic of the memory sub-system at a time when the user data is stored at the memory sub-system.

\* \* \* \* \*